(12) United States Patent
Jenkins et al.

(10) Patent No.: US 6,954,920 B2
(45) Date of Patent: Oct. 11, 2005

(54) METHOD, PROGRAM PRODUCT, AND DESIGN TOOL FOR AUTOMATIC TRANSMISSION LINE SELECTION IN APPLICATION SPECIFIC INTEGRATED CIRCUITS

(75) Inventors: Peter J. Jenkins, Colchester, VT (US); Raminderpal Singh, Essex Junction, VT (US); Sebastian T. Ventrone, South Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 72 days.

(21) Appl. No.: 10/604,174

(22) Filed: Jun. 30, 2003

(65) Prior Publication Data

US 2004/0268285 A1 Dec. 30, 2004

(51) Int. Cl.[7] .............................................. G06F 17/50
(52) U.S. Cl. ............................. 716/13; 716/12; 716/14
(58) Field of Search ............................... 716/13, 12, 14

(56) References Cited

U.S. PATENT DOCUMENTS 5,702,868 A * 12/1997 Kellam et al. .............. 430/312
6,305,001 B1 * 10/2001 Graef ........................... 716/12
6,601,227 B1 * 7/2003 Trimberger ................... 716/12
2004/0090282 A1 * 5/2004 Minami ......................... 333/1

OTHER PUBLICATIONS

Zhu, "Package clock Distribution Design Optimization for High–Speed and Low–Power VLSIs", Feb. 1997, IEEE Transactions o Components, Packaging, and Manufacturing Technology, Part B: Advanced Packaging, vol. 20, iss. 1, pp. 56–63.*

* cited by examiner

Primary Examiner—Matthew Smith
Assistant Examiner—Sun James Lin
(74) Attorney, Agent, or Firm—Richard A. Henkler; Hoffman, Warnick & D'Alessandro LLC

(57) ABSTRACT

A method, program product, and design tool for automatic transmission line selection in application specific integrated circuits. The method includes: determining route paths between blocks of an application specific integrated circuit; scanning the route paths for transmission line replacement candidates; and, for each transmission line replacement candidate, automatically selecting a buffered wire or a transmission line to implement the route path.

20 Claims, 3 Drawing Sheets

METHOD, PROGRAM PRODUCT, AND DESIGN TOOL FOR AUTOMATIC TRANSMISSION LINE SELECTION IN APPLICATION SPECIFIC INTEGRATED CIRCUITS

BACKGROUND OF INVENTION

1. Technical Field

The present invention relates generally to integrated circuits. More particularly, the present invention relates to a method, program product, and design tool for automatically selecting either a buffered wire or a transmission line when routing a communication line between blocks (e.g., cores) of an application specific integrated circuit (ASIC).

2. Related Art

Physical design of large ASICs requires a significant amount of time to route long wires between blocks placed in the design. This is because long wires in general are not compatible with the electrical restrictions placed on ASIC libraries. For example, a long wire may create a maximum capacitance electrical violation at the gate driving the wire and, in addition, may distort the signal traveling along the wire so that an electrical violation is created at the gate receiving the signal. The usual solution employed is the buffering of the signal at one or more points along the entire run of the wire. Implementing this solution can be problematic, however, since the buffers must be placed in open areas in the design, and an electrical analysis must be performed to calculate the correct number and placement of the buffers.

Wiring congestion in core-based ASIC design is also a major problem. For example, in many designs, a limited area is available for placement of wires. The need to insert buffers in the design to meet timing requirements worsens the congestion problem, because the buffers cannot easily be placed within a block. An example of wiring congestion is illustrated in FIG. 1. In particular, wiring between blocks E and B of ASIC 10 creates a congestion problem at the lower right corner of block A, and also requires multiple buffers 12 to satisfy electrical constraints. Although only a single wire is shown in FIG. 1, it should be clear to those skilled in the art that thousands of wires may be present in the areas between the blocks A–E.

Other problems may arise as the size of the blocks increase. For example, longer wires are needed to wire around larger blocks, necessitating the use of additional buffers. This creates more signal delay, reduces the clock frequency, and increases power requirements.

It would be desirable to use other interconnection techniques, such as transmission lines, in lieu of some of the buffered wires to reduce the above-described congestion problem, to limit the use of buffers, and/or to improve the predictability of ASIC performance. Such an implementation is shown in FIG. 2. In particular, in FIG. 2, a transmission line 20 is used to route a connection between core E and core B. Unlike the scenario illustrated in FIG. 1, however, in which the buffered wire passes between the blocks, the transmission line 20 of FIG. 2 passes over core A on its way to core E. This reduces the congestion problem at the lower right corner of core A, and also eliminates the need for several buffers 12. Various performance benefits (e.g., lower delay, lower capacitance, etc.) may also be achieved by replacing buffered wires in an ASIC with transmission lines.

Deciding which of the buffered wires in an ASIC to replace with transmission lines is a time consuming process. Care must be taken to ensure that the use of a transmission line in place of a buffered wire does not have a net negative impact on the ASIC. Process specific parameters and factors such as route length, delay, routability, resistance, capacitance, cross-talk, congestion, power consumption, etc., must be taken into account before deciding which type of connection technique (i.e., buffered wire verses transmission line) should be used. The process specific parameters and factors may also be used to determine which type of transmission line should be used.

Because of the large number of buffered wires that are commonly present in an ASIC design, it is impractical to manually examine large numbers of buffered wires in the ASIC when deciding which of the buffered wires can be replaced by a transmission line. Accordingly, there is a need in the art for a method for automatically examining each buffered wire in the ASIC and determining which of the buffered wires can be replaced by transmission lines.

SUMMARY OF INVENTION

The present invention provides a method, program product, and design tool for automatically selecting either a buffered wire or a transmission line to route a communication line between blocks of an application specific integrated circuit (ASIC).

A first aspect of the present invention is directed to a method for routing communication lines between blocks of an ASIC, comprising: determining route paths between blocks of the ASIC; scanning the route paths for transmission line replacement candidates; and, for each transmission line replacement candidate, automatically selecting a buffered wire or a transmission line to implement the route path.

A second aspect of the present invention is directed to a program product stored on a recordable medium for routing communication lines between blocks of an ASIC which, when executed, comprises: program code for determining route paths between blocks of the ASIC; program code for scanning the route paths for transmission line replacement candidates; and program code for automatically selecting a buffered wire or a transmission line to implement the route path, for each transmission line replacement candidate.

A third aspect of the present invention is directed to a design tool for routing communication lines between blocks of an ASIC, comprising: a system for determining route paths between blocks of the ASIC; a system for scanning the route paths for transmission line replacement candidates; and a system for automatically selecting a buffered wire or a transmission line to implement the route path, for each transmission line replacement candidate.

The foregoing and other features of the invention will be apparent from the following more particular description of embodiments of the invention.

BRIEF DESCRIPTION OF DRAWINGS

The embodiments of this invention will be described in detail, with reference to the following figures, wherein like designations denote like elements, and wherein.

DETAILED DESCRIPTION

The present invention provides a method, program product, and design tool for automatically selecting either a buffered wire or a transmission line to route a communication line between blocks of an application specific integrated circuit (ASIC).

Figure 3:
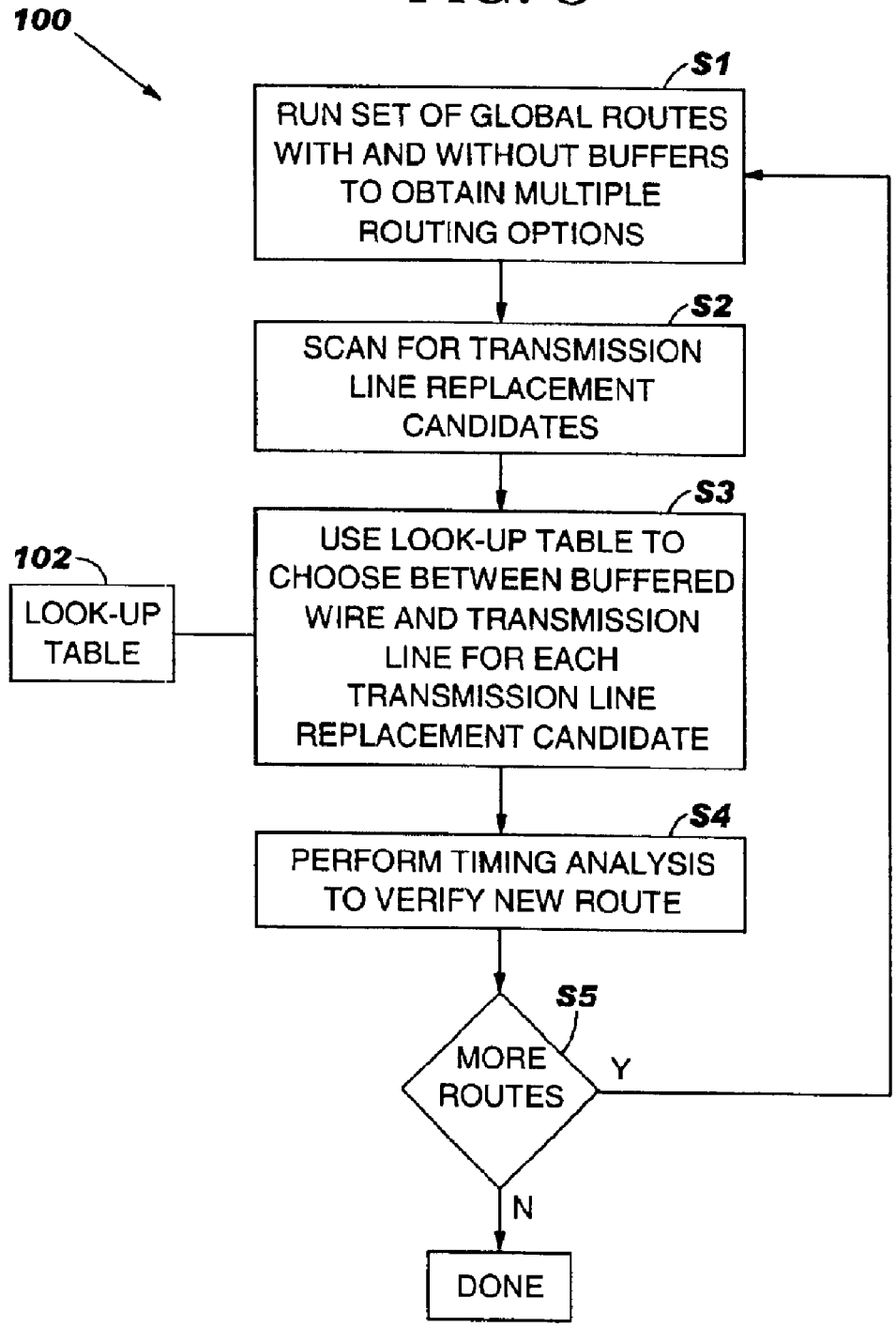
FIG. 3 illustrates a flowchart depicting a method for automatically selecting between a buffered wire and a transmission line in accordance with the present invention.

A flowchart 100 depicting a method for automatically selecting between a buffered wire and a transmission line in accordance with the present invention is illustrated in FIG. 3.

In step S1, for a proposed ASIC design, a global router is run using a standard electronic design automation (EDA) tool with and without buffers to generate multiple wire routing solutions for a set (e.g., one or more) of route paths. Process specific parameters, such as delay, capacitance, etc., are determined for the route paths in each wire routing solution. In step S2, the route paths generated in step S1 are scanned for transmission line replacement candidates. The transmission line replacement candidates may include, for example, those route paths that pass over blocks in the ASIC, those route paths that do not require buffers, etc. Other criteria for choosing transmission line replacement candidates may also be employed. In general, any route path that would benefit from the use of a transmission line in place of a buffered wire may be selected as a transmission line replacement candidate.

In the disclosed embodiment of the present invention, a transmission line is implemented using a coplanar waveguide (CPW). As known in the art, a CPW transmission line requires the use of dual parallel route paths (e.g., a signal wire and an adjacent ground wire to isolate the signal wire from other elements on the ASIC). The dual route paths can be provided by pairing the route paths horizontally on the same layer of metal (i.e., single layer), or vertically over two adjacent layers of metal (i.e., multi-layer). In step S2, because CPW transmission lines are being used, the requirement of dual route paths must be taken into account when selecting a transmission line replacement candidate. Although the present invention is described with regard to CPW transmission lines, other suitable types of transmission lines now known or later developed may also be used in the present invention.

The route paths of the transmission line replacement candidates are subsequently examined in step S3 to determine which of the candidates should be implemented with a CPW transmission line and which of the candidates should be implemented using a traditional buffered wire. This is done by comparing, for a given route path, the process specific parameters previously determined in step S1 for a buffered wire against the process specific parameters of the transmission line technology (i.e., CPW in the present embodiment) that will be used to produce a transmission line. As shown in FIG. 3, the process specific parameters of CPW transmission lines (single/multilayer) are stored in a look-up table 102. The process specific parameters may include, for example, signal delay, routability, etc.

Figure 1:
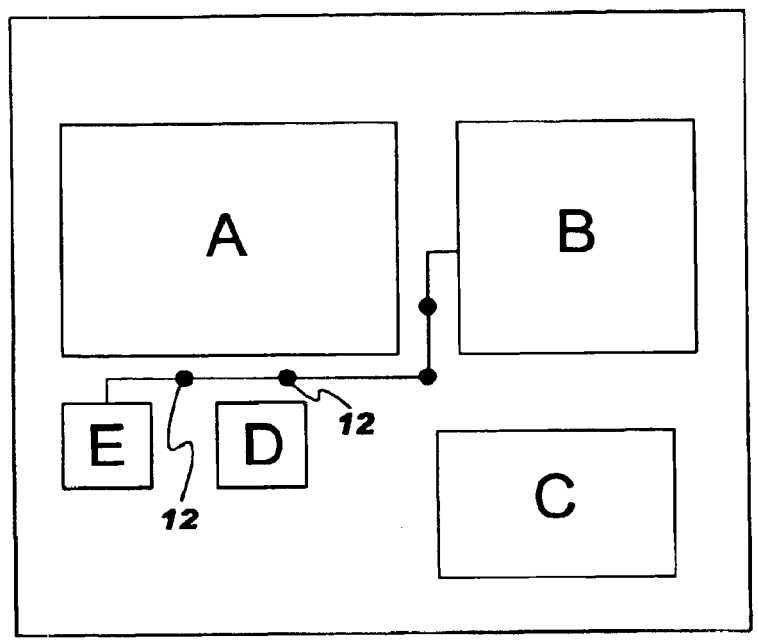
FIG. 1 illustrates an ASIC having a plurality of blocks and a buffered wire connecting two of the blocks.
Figure 2:
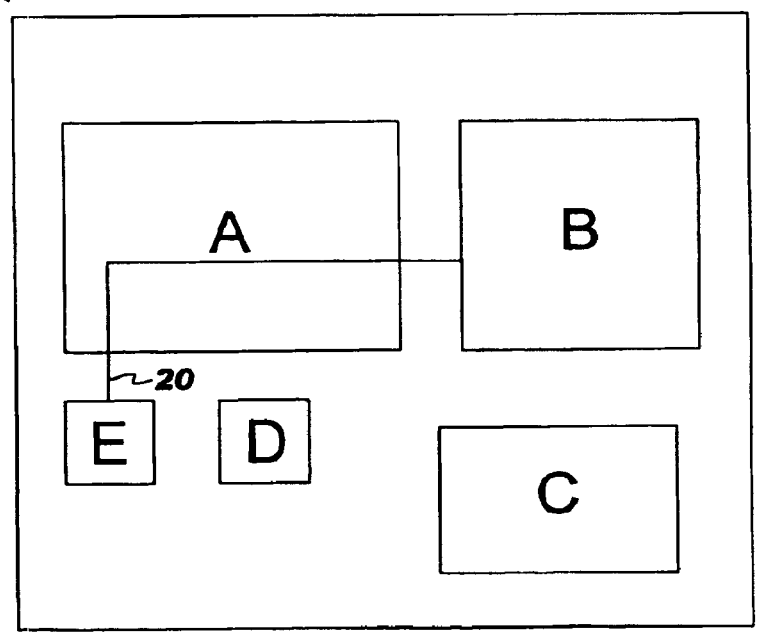
FIG. 2 illustrates the ASIC of FIG. 1 with the buffered wire replaced by a transmission line.

For example, the signal delay for a buffered wire extending between blocks E and B in FIG. 1 is known from step S1. The signal delay for a corresponding CPW transmission line extending between blocks E and B over block A (FIG. 2) is determined by retrieving delay information from the look-up table 102 for the length of the CPW transmission line and the structure of the wire paths that are available (e.g., single/multilayer—each type introduces a different delay per unit length). The delay values for the buffered wire and CPW transmission wire solutions are then compared, and the wiring technique with the lower delay is chosen. Of course, other criteria, such as routability, capacitance, etc., may also be examined and compared in step S3 before a final decision to use a CPW transmission line in place of a traditional buffered wire for a given route path can be made.

In step S4, a timing analysis is performed to verify each new route path provided using a transmission line. If the necessary timing requirements are met, then the transmission line route path is used. If the timing requirements are not met, the new route path is discarded and a traditional buffered wire is used. This process is repeated as necessary (step S5) until the wire routing solutions for all route paths have been examined for transmission line candidates. Thus, in accordance with the present invention, the use of route paths in an ASIC design is optimized by automatically determining which route paths in the design can be implemented using transmission lines in lieu of traditional buffered wires.

Figure 4:
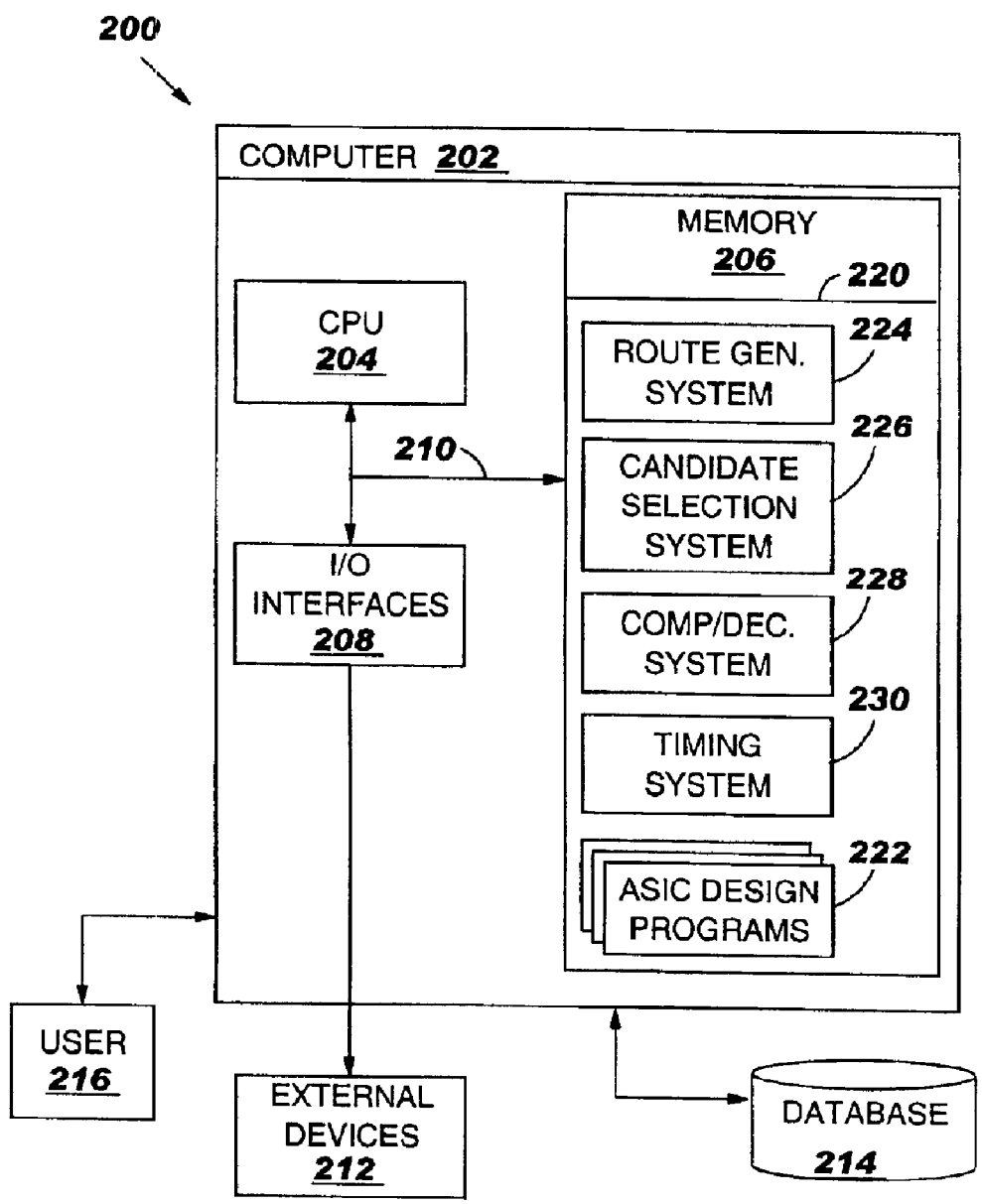
FIG. 4 illustrates an ASIC design tool in accordance with the present invention.

FIG. 4 depicts an ASIC design tool 200 for implementing the method of the present invention. The design tool 200 includes a computer 202 that generally comprises central processing unit (CPU) 204, memory 206, input/output (I/O) interface 208, bus 210, external devices 212 and database 214. A user 216 interacts with the design tool 200 during the design of an ASIC.

Computer 202 can comprise any general purpose or specific-use system utilizing standard operating system software, which is designed to drive the operation of the particular hardware and which is compatible with other system components and I/O controllers. The CPU 204 may comprise a single processing unit, multiple processing units capable of parallel operation, or can be distributed across one or more processing units in one or more locations, e.g., on a client and server. The memory 206 may comprise any known type of data storage and/or transmission media, including magnetic media, optical media, random access memory (RAM), etc. Moreover, similar to the CPU 204, the memory 206 may reside at a single physical location, comprising one or more types of data storage, or be distributed across a plurality of physical systems in various forms.

I/O interfaces 208 may comprise any known system for exchanging information with one or more external devices 212. The external devices 212 may comprise any known type of input/output device capable of communicating with I/O interfaces 208 with or without additional devices. The bus 210 provides a communication link between each of the components in computer 202 and likewise may comprise any known type of transmission link, including electrical, optical, wireless, etc. Other known components may also be incorporated into the computer 202.

The database 214 may provide storage for information necessary to carry out the present invention. For example, the look-up table 102 (FIG. 3) may be stored within the database 214. The database 214 may include one or more storage devices, such as a magnetic disk drive or an optical disk drive. Further, the database 214 can include data distributed across a network such as LAN, WAN, or the Internet.

A transmission line selection system 220 capable of performing the transmission line selection method of the present invention is shown stored in memory 206 as computer program code. Other ASIC design programs 222, again shown as stored in memory 206 as computer code, may also be available in the design tool 200.

The transmission line selection system 220 includes a route generation system 224 for running global routes for an ASIC with and without buffers (step S1, FIG. 3). The transmission line selection system 220 further includes a transmission line replacement candidate system 226 for selecting transmission line replacement candidates from the path routes generated by the route generation system 224 (step S2, FIG. 3), a comparison/decision system 228 for comparing, for a given route, various parameters of a transmission line and a corresponding buffered wire, and for choosing the best wiring option based on the comparison (step S3, FIG. 3), and a timing system 230 for verifying a new route path implemented using a transmission line in place of a buffered wire (step S4, FIG. 3).

As indicated above, it should be understood that the present invention can be realized in hardware, software, or a combination of hardware and software. Any kind of computer/server system(s)—or other apparatus adapted for carrying out the methods described herein—is suited. A typical combination of hardware and software could be a general purpose computer system with a computer program that, when loaded and executed, carries out the respective methods described herein. Alternatively, a specific use computer, containing specialized hardware for carrying out one or more of the functional tasks of the invention, could be utilized. The present invention can also be embedded in a computer program product, which comprises all the respective features enabling the implementation of the methods described herein, and which—when loaded in a computer system—is able to carry out these methods. Computer program, software program, program, or software, in the present context mean any expression, in any language, code or notation, of a set of instructions intended to cause a system having an information processing capability to perform a particular function either directly or after either or both of the following: (a) conversion to another language, code or notation; and/or (b) reproduction in a different material form.

While this invention has been described in conjunction with the specific embodiments outlined above, it is evident that many alternatives, modifications and variations will be apparent to those skilled in the art. Accordingly, the embodiments of the invention as set forth above are intended to be illustrative, not limiting. Various changes may be made without departing from the spirit and scope of the invention as defined in the following claims.

What is claimed is:

1. A method for routing communication lines between blocks of an application specific integrated circuit (ASIC), comprising:
   determining route paths between blocks of the ASIC;
   scanning the route paths for transmission line replacement candidates; and
   for each transmission line replacement candidate, automatically selecting a buffered wire or a transmission line to implement a route path, based on process specific parameters of the transmission line.

2. The method of claim 1, wherein determining route paths further comprises:
   obtaining multiple route paths using wires with and without buffers.

3. The method of claim 1, wherein a transmission line replacement candidate is selected from the group consisting of a route path that passes over a block of the ASIC and a route path that does not require a buffer.

4. The method of claim 1, wherein automatically selecting a buffered wire or a transmission line to implement a route path further comprises:
   providing a look-up table containing the process specific parameters of the transmission line.

5. The method of claim 4, wherein automatically selecting a buffered wire or a transmission line to implement a route path further comprises:
   determining a length of the route path for the buffered wire;
   determining a length of the route path for the transmission line, and obtaining, based on the process specific parameters of the transmission line contained in the look-up table, a value for the transmission line;
   comparing the value fox the transmission line to a corresponding value for the buffered wire; and
   automatically selecting the buffered wire or the transmission line based on the comparison.

6. The method of claim 5, wherein the value is signal delay per unit length.

7. The method of claim 1, wherein the transmission line comprises a coplanar waveguide transmission line.

8. A program product stored on a recordable medium for routing communication lines between blocks of an application specific integrated circuit (ASIC) which, when executed, comprises:
   program code for determining route paths between blocks of the ASIC;
   program code for scanning the route paths for transmission line replacement candidates; and
   program code for automatically selecting a buffered wire or a transmission line to implement a route path, for each transmission line replacement candidate, based on process specific parameters of the transmission line.

9. The program product of claim 8, wherein the program code for determining route paths further comprises:
   program code for obtaining multiple route paths using wires with and without buffers.

10. The program product of claim 8, wherein a transmission line replacement candidate is selected from the group consisting of a route path that passes over a block of the ASIC and a route path that does not require a buffer.

11. The program product of claim 8, wherein the program code for automatically selecting a buffered wire or a transmission line to implement a route path further comprises:
    program code for accessing a look-up table containing the process specific parameter of the transmission line.

12. The program product of claim 11, wherein the program cods for automatically selecting a buffered wire or a transmission line to implement a route path further comprises:
    program code for determining a length of the route path for the buffered wire;
    program code for determining a length of the route path for the transmission line, and obtaining, based on the process specific parameters of the transmission line contained in the look-up table, a value for the transmission line;
    program code for comparing the value for the transmission line to a corresponding value for the buffered wire; and
    program code for automatically selecting the buffered wire or the transmission line based on the comparison.

13. The program product of claim 12, wherein the value is signal delay per unit length.

14. A design tool for routing communication lines between blocks of an application specific integrated circuit (ASIC), comprising:

a system for determining route paths between blocks of the ASIC;

a system for scanning the route paths for transmission line replacement candidates; and a system for automatically selecting a buffered wire or a transmission line to implement a route path, for each transmission line replacement candidate, based on process specific parameters of the transmission line.

15. The design tool of claim 14, wherein the system for determining route paths further comprises:

a system for obtaining multiple route paths using wires with and without buffers.

16. The design tool of claim 14, wherein a transmission line replacement candidate is selected from the group consisting of a route path that passes over a block of the ASIC and a route path that does not require a buffer.

17. The design tool of claim 14, wherein the system for automatically selecting a buffered wire or a transmission line to implement a route path further comprises:

a look-up table containing the process specific parameters of the transmission line.

18. The design tool of claim 17, wherein the system for automatically selecting a buffered wire or a transmission line to implement a route path further comprises:

a system for determining a length of the route path for the buffered wire;

a system for determining a length of the route path for the transmission line, and obtaining, based on the process specific parameters of the transmission line contained in the look-up table, a value for the transmission line;

a system for comparing the value for the transmission line to a corresponding value for the buffered wire; and a system for automatically selecting the buffered wire or the transmission line based on the comparison.

19. The design tool of claim 18, wherein the value is signal delay per unit length.

20. The design tool of claim 14, wherein the transmission line comprises a coplanar waveguide transmission line.

* * * * *

UNITED STATES PATENT AND TRADEMARK OFFICE
CERTIFICATE OF CORRECTION

PATENT NO. : 6,954,920 B2
DATED : October 11, 2005
INVENTOR(S) : Jenkins et al.

It is certified that error appears in the above-identified patent and that said Letters Patent is hereby corrected as shown below:

Column 6,
Line 12, take out "fox" and insert -- for --.
Line 44, take out "parameter" and insert -- parameters --.
Line 46, take out "cods" and insert -- codes --.

Signed and Sealed this

Tenth Day of January, 2006

JON W. DUDAS
*Director of the United States Patent and Trademark Office*